April 12, 1966 FRIEDRICH-WILHELM DEHMELT ETAL 3,245,846
TRANSISTOR
Filed Dec. 18, 1961
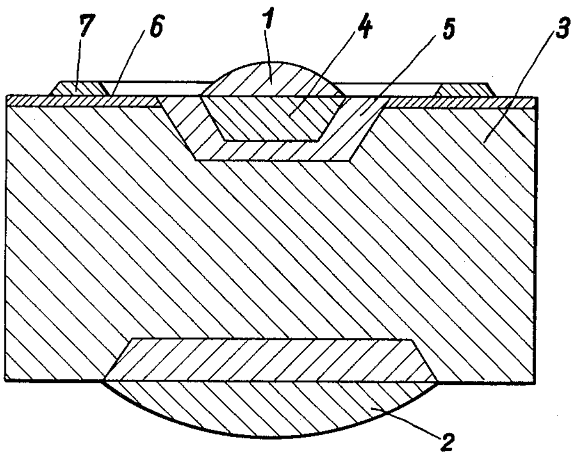
Friedrich-Wilhelm Dehmelt
Gerhard Grust
Inventors:
By: George H. Spencer
Attorney United States Patent Office 3,245,846

Patented Apr. 12, 1966

3,245,846

TRANSISTOR

Friedrich-Wilhelm Dehmelt and Gerhard Grust, Ulm (Danube), Germany, assignors to Telefunken Patent-verwertungs-G.m.b.H., Ulm (Danube), Germany Filed Dec. 18, 1961, Ser. No. 160,108
Claims priority, application Germany, Dec. 29, 1960, T 19,479
2 Claims. (Cl. 148—33.5)

The present invention relates generally to transistors, and, more particularly, to a transistor of the drift type.

As is known, an alloy junction type transistor has a semiconductor body of the same type conductivity as the base zone, with the emitter zone alloyed into one surface and the collector zone alloyed into the other surface thereof. In a drift transistor, the difference is that, aside from being constructed as a normal alloy junction type transistor, a diffusion layer or drift doping layer is provided in front of the emitter zone, i.e., between the emitter zone and the remainder of the transistor. The conductivity of this diffusion layer is not constant, but is provided with a conductivity gradient. This gradient or variability of the conductivity of the diffusion layer is arranged so that the conductivity decreases from the emitter zone towards the collector zone. If a semiconductor body is provided with a zone of variable conductivity or variable doping, which is the same thing, an electric field builds up in this zone during operation of the transistor. This causes an acceleration or deceleration of the charge carriers, depending upon the direction of the electric field.

In the drift type transistor the variable doping provided in this diffusion layer is arranged so that the charge carriers injected into the base zone from the emitter are accelerated by the variable doping. Due to this acceleration the transit time of the charge carriers along their paths between the collector zone to the emitter zone is shortened in the base zone.

Generally, a drift transistor is produced by using a semiconductor body of the same type of conductivity as the base zone, and is always arranged with a diffusion layer of a conductivity type which is the same as that of the base zone. It is due to the nature of this layer diffused into the surface of a semiconductor body that the impurity concentration in this layer decreases with increasing distance from the surface of the semiconductor body. Therefore, the impurity gradient, which is required in the drift transistor, may be provided in the base zone by the layer which is diffused into the surface of the semiconductor body, if this diffused layer extends further or deeper into the body than the emitter zone, so that a portion of the diffusion layer is arranged in front of the emitter zone.

The impurity gradient is undesired on the collector side of the transistor, and therefore the semiconductor body on the collector side is ground down to the point where the diffusion layer on the collector side disappears. At this point the emitter and collector zones are alloyed into opposite sides of the semiconductor body. During alloying of the emitter, care must be taken that the alloying depth of the emitter zone be less than the depth of the diffusion layer in order for the impurity gradient for the acceleration of the charge carriers to remain present in front of the emitter zone.

In the process of manufacture which has been described, the drift doping required in the base zone is provided by preliminary diffusion, which is so called since the drift doping is diffused into the semiconductor body before the emitter and collector zones are alloyed into the body. Another process differs from this afore-mentioned process, in that the diffusion layer, arranged in front of the emitter zone, is produced after the emitter zone has been alloyed into the semiconductor body. Such diffusion from an alloyed zone requires that the alloying material contain not only the impurities necessary for the alloyed zone, but that it also contain the impurity material for the impurity which is to be diffused out of the alloyed zone to form the other zone. This diffusion process from the alloying zone has an advantage in that the doping gradient in the entire region about the emitter zone is more uniform than in the case of preliminary diffusion. Therefore, the differences in transit time of the charge carriers emitted from the emitter zone are considerably smaller in the type of drift transistors produced by diffusion from the emitter zone than in the type produced by preliminary diffusion. This is because in the transistor produced without preliminary diffusion, the charge carriers undergo approximately the same acceleration at every point upon leaving the emitter zone.

In order to reduce the collector capacitance, a drift transistor requires a starting material having a relatively high resistance. This means that a comparatively high base resistance will be obtained in a base electrode applied to the emitter side if steps are not taken to bring the base electrode sufficiently close to the emitter electrode so that the base electrode is mounted directly upon the diffusion layer of low resistance which is diffused from the emitter zone.

With these defects of the prior art in mind, it is a main object of this invention to provide a drift transistor with a diffusion layer which is produced by diffusion from the emitter zone and wherein the base zone need not be so close to the emitter zone as to be disposed on the diffusion zone.

Another object of this invention is to provide a drift transistor of the character described which is exceedingly simple, and is inexpensive to produce.

These objects and others ancillary thereto are accomplished according to preferred embodiments of the invention, wherein a drift transistor is constructed with an emitter zone alloyed into the base zone and with the drift doping layer produced by diffusion from the emitter zone. A surface diffusion layer of the same conductivity type as the base zone is provided on the emitter side having a low resistance compared to the original doping of the base zone.

Preferably, the diffusion constant of the impurities forming this diffusion layer is smaller than the diffusion constant of the impurities diffused from the emitter zone. This is because an undesirable expansion or extension of the surface diffusion layer would occur if this relationship of the diffusion constants were not followed. The depth of the surface diffusion layer should be sufficiently small that the impurities of the layer do not affect the doping conditions of the diffusion layer which is diffused out of the emitter zone or the drift doping layer.

Additional objects and advantages of the present invention will become apparent upon consideration of the following description when taken in conjunction with the accompanying drawing, wherein the single figure is a cross-sectional view of the transistor of the present invention.

With more particular reference to the drawing, the drift transistor is constructed of a semiconductor body 3 having emitter and collector electrodes 1 and 2, respectively, alloyed into this body. The alloyed emitter zone 4 is thereby produced. A diffusion layer or drift doping layer 5 is provided around or in front of the alloyed emitter zone by diffusion from this zone 4. In order to produce a low resistance connection between the drift doping layer 5 and the ring-shaped base electrode 7, which is applied on the emitter side, a surface diffusion layer 6 of the same conductivity type as the semiconductor body 3 is provided which has a particularly low resistance.

In order to produce this transistor, the semiconductor body 3 is first provided with a surface diffusion layer 6. The impurity concentration of this surface layer should be chosen so that a conductivity of about 100 $ohm^{-1} cm.^{-1}$ is provided for this layer. After this, the portion of the surface diffusion layer 6 which is present on the collector side has to be removed, and the emitter electrode 1 and the collector electrode 2 are alloyed into the semiconductor body 3. This process alloys the emitter zone through the surface diffusion layer 6 which is present on the emitter side. Upon termination of the alloying process, diffusion layer 5 is diffused out of the emitter zone 4 for accelerating the charge carriers. The resistance of layer 5, diffused from the emitter zone, corresponds approximately to the conductivity of the surface diffusion layer 6. An electrically conducting connection with the base zone is provided by the ring-shaped base electrode 7 which is alloyed onto the semiconductor body on the same side thereof as the emitter zone. The base connection is provided on the emitter side, and the surface diffusion layer 6 present on the emitter side in this case has the advantage that the base electrode 7 has a low resistance conducting connection with the diffusion layer 5 so that the base resistance, which is active between the base electrode and the emitter zone, is very small.

Gallium and antimony are suitable impurity materials for the emitter alloying pill. Gallium produces the conductivity type of the emitter zone and antimony produces the diffusion layer which is to be disposed in front of the emitter zone. Generally, a suitable carrier material may be used for the alloying pills in addition to the impurity materials. A suitable impurity material for producing the surface diffusion layer is arsenic, for example.

It will be understood that the above description of the present inventon is susceptible to various modifications, changes, and adaptations, and the same are intended to be comprehended within the meaning and range of equivalents of the appended claims.

What is claimed is:

1. A drift transistor comprising, in combination:

(a) a semiconductor body of one type conductivity to provide a base zone;

(b) a collector zone on one side of said body;

(c) an emitter zone alloyed into said base zone;

(d) a drift doping layer diffused from said emitter zone; and (e) a surface diffusion layer on the emitter zone side of the body of the same type conductivity as the base zone and of lower resistance with respect to the original doping of the base zone.

2. A drift transistor as defined in claim 1, wherein said surface diffusion layer is of arsenic and said drift doping layer arranged in front of the emitter zone is of antimony, the impurity diffused out of the emitter zone having a diffusion constant, and the impurity forming said surface diffusion layer having a diffusion constant which is smaller than the diffusion constant of the impurity diffused out of the emitter zone.

References Cited by the Examiner

UNITED STATES PATENTS

| | | | |
|---|---|---|---|
| 2,811,653 | 10/1957 | Moore | 148—33 |
| 2,868,683 | 1/1959 | Jochems | 148—33 |
| 3,029,170 | 4/1962 | Lamming | 148—1.5 |

DAVID L. RECK, *Primary Examiner.*

WINSTON A. DOUGLAS, *Examiner.*

W. C. TOWNSEND, D. L. REISDORF, O. MARJAMA, *Assistant Examiners.*